(12) United States Patent
Toshiyoshi et al.

(10) Patent No.: US 10,840,827 B2
(45) Date of Patent: Nov. 17, 2020

(54) VIBRATION ENERGY HARVESTER

(71) Applicants: The University of Tokyo, Tokyo (JP); Saginomiya Seisakusho, Inc., Tokyo (JP)

(72) Inventors: Hiroshi Toshiyoshi, Tokyo (JP); Hiroyuki Fujita, Tokyo (JP); Hisayuki Ashizawa, Sayama (JP); Hiroyuki Mitsuya, Sayama (JP); Kazunori Ishibashi, Sayama (JP)

(73) Assignees: The University of Tokyo, Tokyo (JP); Saginomiya Seisakusho, Inc., Tokyo (JP)

( * ) Notice: Subject to any disclaimer, the term of this patent is extended or adjusted under 35 U.S.C. 154(b) by 80 days.

(21) Appl. No.: 15/765,142

(22) PCT Filed: Sep. 27, 2016

(86) PCT No.: PCT/JP2016/078368
§ 371 (c)(1),
(2) Date: Mar. 30, 2018

(87) PCT Pub. No.: WO2017/057317
PCT Pub. Date: Apr. 6, 2017

(65) Prior Publication Data
US 2019/0058420 A1 Feb. 21, 2019

(30) Foreign Application Priority Data
Oct. 2, 2015 (JP) .................... 2015-196736

(51) Int. Cl.
*H02N 1/08* (2006.01)

(52) U.S. Cl.
CPC ........ *H02N 1/08* (2013.01); *B81B 2201/0285* (2013.01); *B81B 2203/0136* (2013.01)

(58) Field of Classification Search
CPC .............. H02N 1/08; B81B 2201/0285; B81B 2203/0136; F03G 7/08
(Continued)

(56) References Cited

U.S. PATENT DOCUMENTS

| 2005/0162811 A1* | 7/2005 | Obi ..................... G02B 6/3584 361/437 |
| 2012/0283807 A1* | 11/2012 | Deterre ................ A61N 1/3785 607/116 |

(Continued)

FOREIGN PATENT DOCUMENTS

| CN | 102435185 A | 5/2012 |
| EP | 1 020 984 A2 | 7/2000 |

(Continued)

OTHER PUBLICATIONS

Ito, Machine Translation of JP2011163967, Aug. 2011 (Year: 2011).*
International Search Report (PCT/ISA/210) issued in PCT Application No. PCT/JP2016/078368 dated Nov. 1, 2016 with English translation (three pages).

(Continued)

*Primary Examiner* — Quyen P Leung
*Assistant Examiner* — Eric Johnson
(74) *Attorney, Agent, or Firm* — Crowell & Moring LLP

(57) ABSTRACT

A vibration energy harvester includes: a first electrode; and a second electrode that can be displaced relative to the first electrode along a predetermined vibrating direction. At least either of a surface of the first electrode and a surface of the second electrode facing opposite each other is electrically charged. Power is generated as the second electrode becomes displaced causing a change in electrostatic capacitance between the first electrode and the second electrode. A range having included therein at least a vibrational center of the second electrode, over which the electrostatic capacitance remains unchanged even as the second electrode is displaced, is set.

6 Claims, 20 Drawing Sheets

(58) Field of Classification Search
USPC .................................................. 310/308, 309
See application file for complete search history.

(56) References Cited

U.S. PATENT DOCUMENTS

| | | | | |
|---|---|---|---|---|
| 2013/0221799 | A1* | 8/2013 | Nakatsuka | H02N 1/004 310/300 |
| 2014/0111061 | A1* | 4/2014 | Yamakawa | H02N 1/08 310/300 |
| 2014/0339954 | A1 | 11/2014 | Yamakawa et al. | |

FOREIGN PATENT DOCUMENTS

| | | | |
|---|---|---|---|
| JP | 2009-268309 A | | 11/2009 |
| JP | 2010-273510 A | | 12/2010 |
| JP | 2011-87384 A | | 4/2011 |
| JP | 2011163967 A | * | 8/2011 |
| JP | 5551914 B2 | | 7/2014 |

OTHER PUBLICATIONS

Japanese-language Written Opinion (PCT/ISA/237) issued in PCT Application No. PCT/JP2016/078368 dated Nov. 1, 2016 (three pages).

Misawa et al., "A Potassium Electret Energy Harvester for 3D-Stack Assembly" MEMS 2015, Jan. 22, 2015, pp. 1071-1074.

Misawa et al., "Reliability of potassium ion electret in silicon oxide for vibrational energy harvester applications" Japanese Journal of Applied Physics, 2015, pp. 067201-1-067201-5, vol. 54.

Suzuki "Recent Progress in MEMS Electret Generator for Energy Harvesting" IEEJ Transactions on Electrical and Electronic Engineering, 2011, pp. 101-111, vol. 6, John Wiley & Sons, Inc.

Shibata et al., "In Situ Measurement of Charging Process in Electret-Based Comb-Drive Actuator and High-Voltage Charging" Journal of Microelectromechanical Systems, 2014, pp. 1-9.

Extended European Search Report issued in counterpart European Application No. 16851488.3 dated Apr. 29, 2019 (seven pages).

* cited by examiner

FIG. 7A
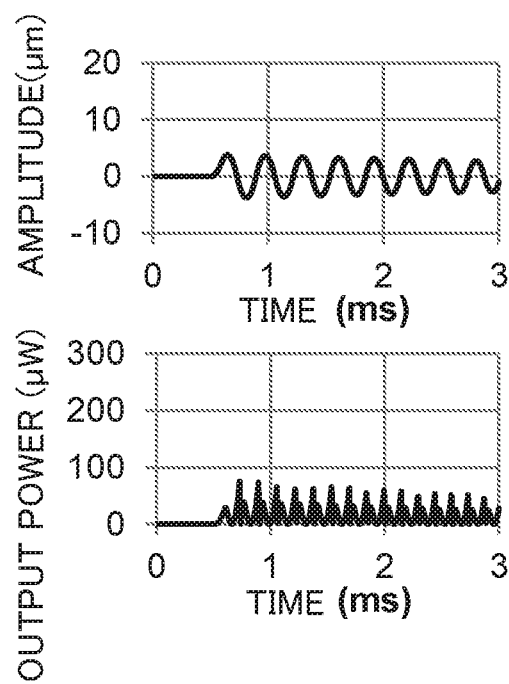
FIG. 7B
FIG. 7C
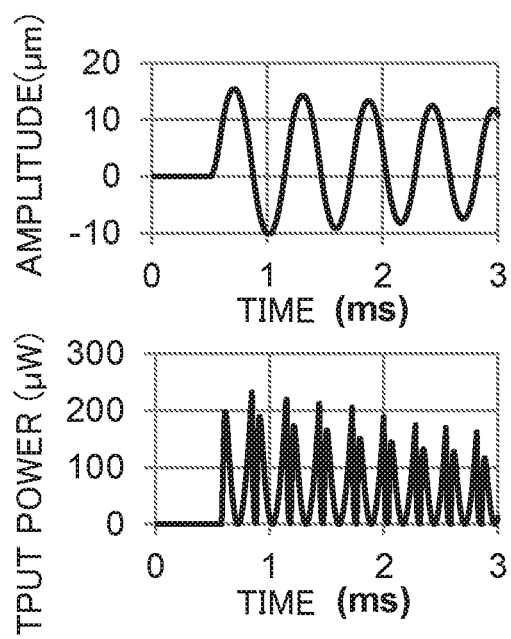
FIG. 7D

FIG. 8A
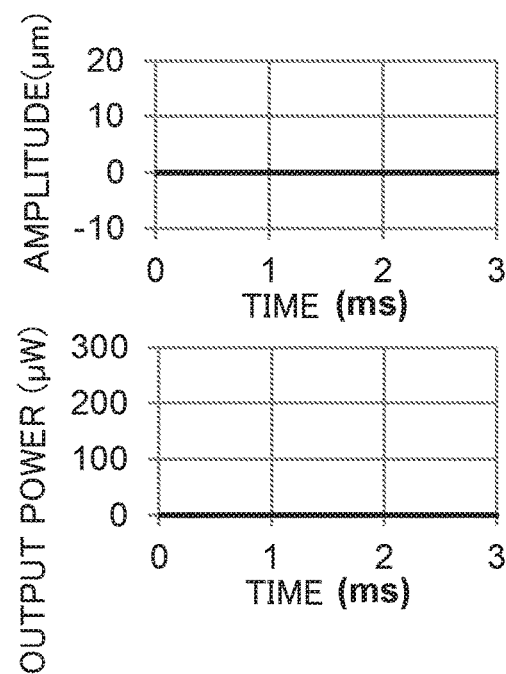
FIG. 8B
FIG. 8C
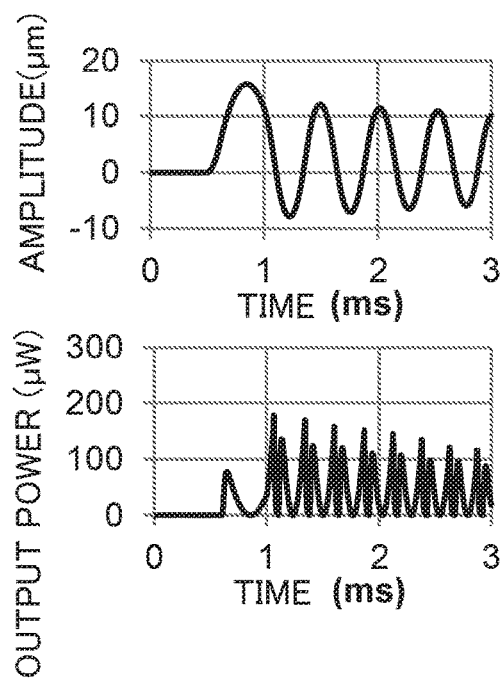
FIG. 8D

VIBRATION ENERGY HARVESTER

TECHNICAL FIELD

The present invention relates to a vibration energy harvester.

BACKGROUND ART

The energy harvesting technologies that enable the harvesting of energy in the environment, having been garnering increasing interest in recent years, include a method through which electric power is generated from the energy of vibrations in the environment by using vibration energy harvesters (vibration power generating devices). The use of electrostatic force, induced via an electret, in a vibration energy harvester utilized in such applications has been proposed so as to allow the vibration energy harvester to be provided as a compact unit that assures a high level of power generation efficiency. For instance, PTL 1 discloses an electrostatic induction-type conversion element having electrets formed by using a soft x-ray at perpendicular surfaces of comb-tooth electrodes formed at a movable portion and a fixed portion.

CITATION LIST

Patent Literature

PTL1: Publication of Japanese Patent No. 5551914

SUMMARY OF INVENTION

Technical Problem

The electrostatic induction-type conversion element disclosed in PTL 1 generates power by applying an excitation force, induced via an environmental vibration, to the movable portion along a specific direction. In this situation, as the area over which the electret surfaces of the comb-tooth electrodes facing opposite each other overlap each other changes, mechanical work is converted to electrostatic energy via an electrostatic force at work between the comb-tooth electrodes and an electromotive force is generated as a result. However, in order to cause a change in the area over which the electret surfaces overlap each other by exciting the movable portion in a stationary state, the inertial force that will occur at the movable portion as it is excited must overcome a predetermined electrostatic force gap corresponding to the electrostatic force at the electrets. This means that if the vibrational acceleration is small, the movable portion cannot be moved and thus power cannot be generated.

Solution to Problem

According to the first aspect of the present invention, a vibration energy harvester comprises: a first electrode; and a second electrode that can be displaced relative to the first electrode along a predetermined vibrating direction. At least either of a surface of the first electrode and a surface of the second electrode facing opposite each other is electrically charged. Power is generated as the second electrode becomes displaced causing a change in electrostatic capacitance between the first electrode and the second electrode. A range having included therein at least a vibrational center of the second electrode, over which the electrostatic capacitance remains unchanged even as the second electrode is displaced, is set.

According to the second aspect of the present invention, in the vibration energy harvester according to the first aspect, it is preferred that the first electrode is a fixed electrode.

According to the third aspect of the present invention, in the vibration energy harvester according to the first aspect, it is preferred that the first electrode is a movable electrode.

According to the fourth aspect of the present invention, in the vibration energy harvester according to any one of the first through third aspects, it is preferred that the first electrode and the second electrode are comb-tooth electrodes.

According to the fifth aspect of the present invention, in the vibration energy harvester according to the fourth aspect, it is preferred that the vibrating direction is a direction running perpendicular to a direction along which individual comb teeth at the comb-tooth electrodes extend and also perpendicular to a direction along which the comb teeth at the comb-tooth electrodes are disposed one after another.

According to the sixth aspect of the present invention, in the vibration energy harvester according to the fifth aspect, it is preferred that the range over which the electrostatic capacitance remains unchanged is created by forming a staged portion with a depth of stage set along the vibrating direction, in at least part of the comb-tooth electrode.

According to the seventh aspect of the present invention, in the vibration energy harvester according to the first aspect, it is preferred that the first electrode and the second electrode respectively include first projecting portions and second projecting portions disposed over predetermined intervals along the vibrating direction so as to face opposite each other; and the range over which the electrostatic capacitance remains unchanged is created by setting a width of each of the first projecting portions at the first electrode, measured along the vibrating direction, and a width of each of the second projecting portions at the second electrode, measured along the vibrating direction, different from each other.

Advantageous Effects of Invention

According to the present invention, a vibration energy harvester capable of generating power even when the acceleration of an excitation is low can be provided.

BRIEF DESCRIPTION OF DRAWINGS

FIGS. 7A to 7D show diagrams indicating the relationship between the amplitude of the movable electrode and the output power pertinent to the vibration energy harvester achieved as a comparison example, and the relationship between the amplitude at the movable electrode and the output power pertinent to the vibration energy harvester achieved in the first embodiment.

FIGS. 8A to 8D show diagrams indicating the relationship between the amplitude at the movable electrode and the output power pertinent to the vibration energy harvester achieved as a comparison example, and the relationship between the amplitude at the movable electrode and the output power pertinent to the vibration energy harvester achieved in the first embodiment.

DESCRIPTION OF EMBODIMENTS

The following is a description of embodiments of the present invention given in reference to drawings.

First Embodiment

Figure 1:
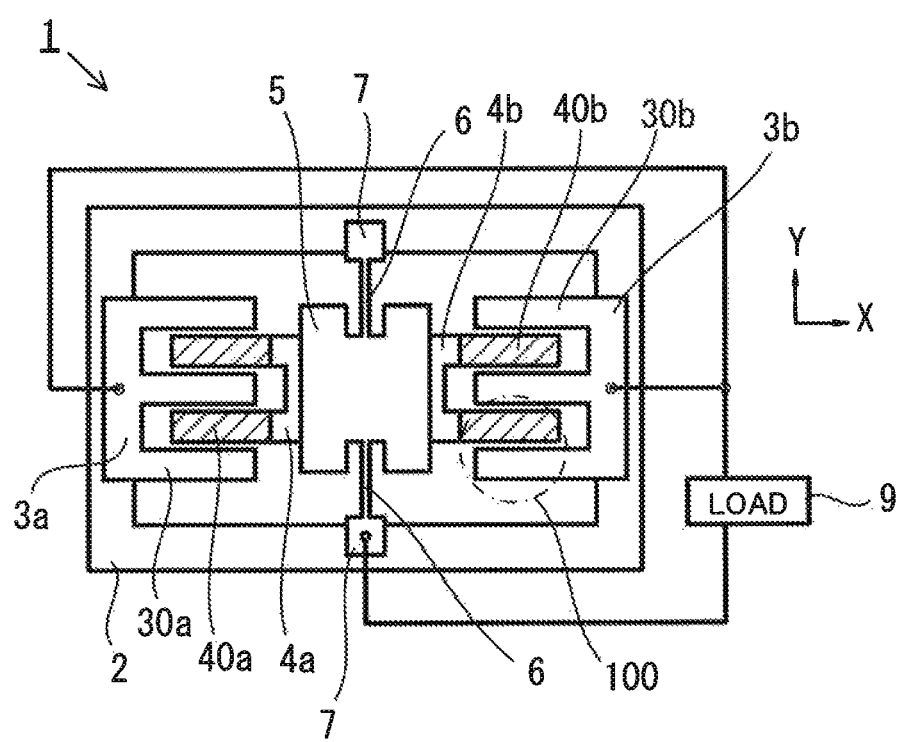
FIG. 1 shows a plan view schematically illustrating the structure of the vibration energy harvester achieved in a first embodiment of the present invention.

FIG. 1 is a plan view schematically illustrating the structure of a vibration energy harvester 1 achieved in the first embodiment of the present invention. The vibration energy harvester 1 includes a base 2, fixed electrodes 3a and 3b, movable electrodes 4a and 4b, a movable portion 5, an elastic support portion 6 and a connection pad portion 7. A load 9 is connected to the vibration energy harvester 1.

As a FIG. 1 shows, the fixed electrodes 3a and 3b and the movable electrodes 4a and 4b each assume a comb tooth structure. A plurality of comb teeth 30a are formed at the fixed electrode 3a and a plurality of comb teeth 40a are formed at the movable electrode 4a. The fixed electrode 3a and the movable electrode 4a are disposed so as to allow the comb teeth 30a and the comb teeth 40a to be engaged with each other. Likewise, a plurality of comb teeth 30b are formed at the fixed electrode 3b and a plurality of comb teeth 40b are formed at the movable electrode 4b. The fixed electrode 3b and the movable electrode 4b are disposed so as to allow the comb teeth 30b and the comb teeth 40b to be engaged with each other.

As described above, the fixed electrodes 3a and 3b are structured as fixed comb-tooth electrodes and the movable electrodes 4a and 4b are structured as movable comb-tooth electrodes. A comb-tooth electrode includes a plurality of comb teeth formed side-by-side, as do the fixed electrodes 3a and 3b and the movable electrodes 4a and 4b in FIG. 1. It is to be noted that the comb-tooth electrodes according to the present invention may include comb teeth in quantities other than those indicated in FIG. 1. When the comb-tooth electrodes have minimum number of the comb teeth, either a fixed comb-tooth electrode or a movable comb-tooth electrode having at least two comb teeth formed thereat, and the other electrode having one comb tooth that will fit between the two comb teeth. As long as the comb-tooth electrodes are formed to achieve this basic structure, a vibration energy harvester having functions to be described below can be configured, regardless of the quantities of comb teeth.

Figure 2A:
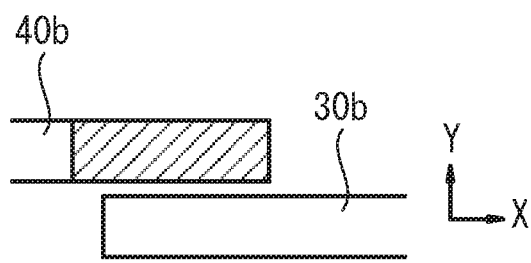
FIGS. 2A to 2C show partial enlargements of the fixed electrode and the movable electrode in the vibration energy harvester achieved in the first embodiment of the present invention.
Figure 2B:
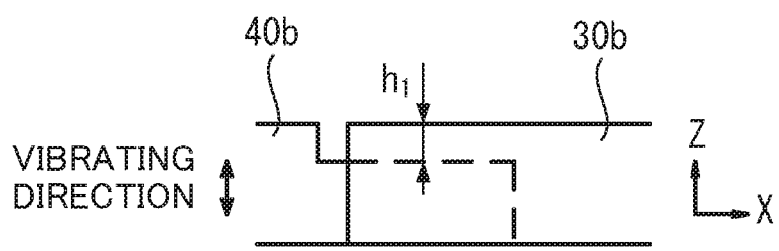
Figure 2C:
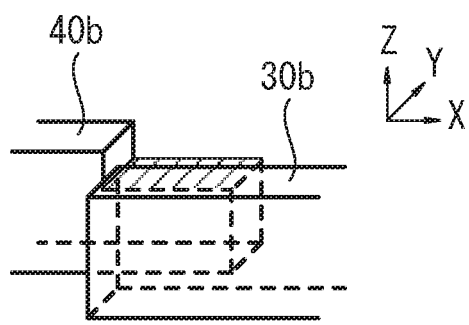

FIG. 2 presents partial enlargements of the fixed electrode 3b and the movable electrode 4b in the vibration energy harvester 1 achieved in the first embodiment of the present invention. It provides enlarged views of a specific area 100 in FIG. 1. FIG. 2(a) presents a top view of the specific area 100, FIG. 2(b) is a front view of the specific area 100 and FIG. 2(c) is a perspective of the specific area 100. As shown in FIG. 1 and FIG. 2, the comb teeth 40b at the movable electrode 4b each include a stage formed as an up/down step formed along the up/down direction (the Z direction) in FIG. 2(b), extending over a range (the hatched area in the figure) that includes the area of the comb tooth 40b to be engaged with the comb teeth 30b at the fixed electrode 3b. It is to be noted that while FIG. 2 only shows the staged structure at the comb tooth 40b in the specific area at 100, the other comb tooth 40b at the movable electrode 4b and the comb teeth 40a at the movable electrode 4a, too, assume a similar staged structure.

The movable portion 5 elastically supported at the base 2 via the elastic support portion 6 is allowed to slide along the Z direction together with the movable electrodes 4a and 4b. Although not shown in FIG. 1 or FIG. 2, electrets are formed at least at either of the comb teeth 30a of the fixed electrode 3a and the comb teeth 40a of the movable electrode 4a, which are engaged with each other near the surfaces that face opposite the surfaces of the comb teeth of the other electrode. Electrets are also formed at least at either of the comb teeth 30b of the fixed electrode 3b and the comb teeth 40b of the movable electrode 4b, which are engaged with each other, near the surfaces that face opposite the surfaces of the comb teeth in the other electrode. As a result, the surfaces of at least one electrode, i.e., either the fixed electrode 3a or the movable electrode 4a, which face opposite the surfaces of the other electrode, and the surfaces of at least one electrode, i.e., either the fixed electrode 3b or the movable electrode 4b, which face opposite the surfaces of the other electrode, are electrically charged. Thus, as the movable electrodes 4a and 4b become engaged with the fixed electrodes 3a and 3b respectively, i.e., as the comb teeth 40a and 40b become inserted through the gaps between the comb teeth 30a and 30b respectively, an electrostatic force causes the movable electrodes 4a and 4b to be attracted toward the fixed electrodes 3a and 3b respectively.

The load 9 executes a predetermined operation by using electric power provided from the vibration energy harvester 1. The positive pole side of the load 9 is electrically connected to the fixed electrodes 3a and 3b, whereas the negative pole side of the load 9 is electrically connected to the movable electrodes 4a and 4b via the connection pad portion 7, the elastic support portion 6 and the movable portion 5.

As an environmental vibration causes the vibration energy harvester 1 to oscillate along a direction that contains a Z-direction component, the movable electrodes 4a and 4b vibrate along the Z direction and thus become displaced relative to the fixed electrodes 3a and 3b. The direction along which the movable electrodes 4a and 4b vibrate at this time, i.e., the Z direction, runs perpendicular to the direction (an X direction) along which the comb teeth 30a and 30b at the fixed electrodes 3a and 3b and the comb teeth 40a and 40b at the movable electrodes 4a and 4b extend and also to the direction (a Y direction) along which the comb teeth 30a, 30b, 40a and 40b are disposed one after another. Thus, as the fixed electrodes 3a and 3b and the movable electrodes 4a and 4b become offset relative to each other along the Z direction and the area over which the fixed electrodes 3a and 3b respectively face opposite the movable electrodes 4a and 4b changes, a change occurs in the electrostatic capacitance between the fixed electrode 3a and the movable electrode 4a and between the fixed electrode 3b and between the movable electrode 4b. This change in the electrostatic capacitance, combined with induced electric charges at the electrets, causes a change in the voltage between the fixed electrodes 3a and 3b and the movable electrodes 4a and 4b, resulting in generation of an electromotive force. Power is thus generated in the vibration energy harvester 1. The electromotive force obtained through power generation at the vibration energy harvester 1 is applied to the load 9 via the electric connections described earlier, and the load 9 is thus driven.

Figure 3:
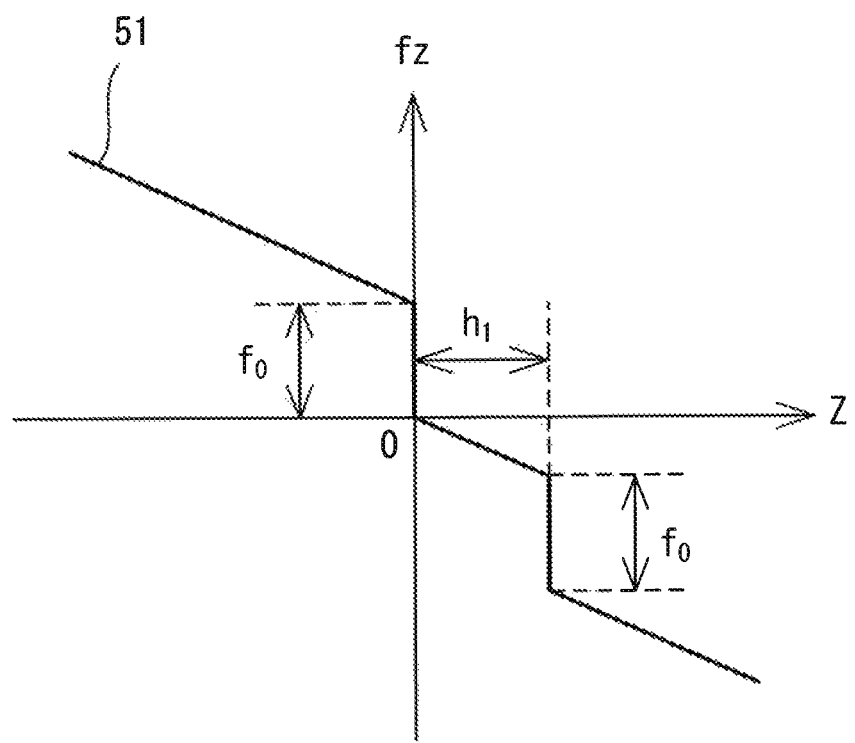
FIG. 3 shows a diagram indicating the relationship between the extent of displacement of the movable electrode and the force applied to the movable electrode, observed in the vibration energy harvester achieved in the first embodiment of the present invention.

FIG. 3 presents a diagram indicating the relationship between the extent of displacement of the movable electrodes 4a and 4h along the Z direction and the force applied to the movable electrodes 4a and 4b observed in the vibration energy harvester 1 achieved in the first embodiment of the present invention. In the embodiment, a force fz in action along the Z direction, applied to the movable electrodes 4a and 4b as the movable electrodes 4a and 4b each vibrate along the Z direction with a vibrational center at Z=0, changes as indicated by a graph 51 in FIG. 3. In FIG. 3, the extent of displacement in the Z direction is indicated along the horizontal axis, whereas the level of the force fz is indicated along the vertical axis.

As the graph 51 indicates, no electrostatic force is at work along the Z direction between the movable electrodes 4a and 4b and the fixed electrodes 3a and 3b over a range $0 \leq Z \leq h1$ that includes the positions Z=0, i.e., the vibrational center around which the movable electrodes 4a and 4b vibrate, and for this reason, the force fz changes at a constant rate in correspondence to a spring constant k of the elastic support portion 6 over this range (hereafter referred to as a non-operation range) in the embodiment. h1 represents the difference between the height of the comb teeth 40b at the staged portions (the length measured along the Z direction) and the height (the length measured along the Z direction) of the comb teeth 30b, as indicated in FIG. 2(b). At the points of transition from the non-operation range to a range Z<0 and to a range h1<Z (hereafter will be referred to as operation ranges), however, the movable electrodes 4a and 4b become offset relative to the fixed electrodes 3a and 3b along the Z direction, as explained earlier, and thus, an electrostatic force is in action along the Z direction between the movable electrodes 4a and 4b and the fixed electrodes 3a and 3b. As a result, the force fz changes acutely at the boundaries (Z=0 and Z=h1) between the non-operation range and the operation ranges as the graph 51 indicates. The extent f0 of change occurring in the force fz at this time will be referred to as an electrostatic force gap.

In the vibration energy harvester 1 in the embodiment, stages are formed at the comb teeth 40a and 40b at the movable electrodes 4a and 4b as described above and, as a result, the non-operation range over which no electrostatic force acts along the Z direction between the movable electrode 4a and the fixed electrode 3a and between the movable electrode 4b and the fixed electrode 3b, a range over which the electrostatic capacitance does not change, is created. This means that at least as the movable electrodes 4a and 4b in a stationary state with Z at 0, start moving in the Z+ direction, there is no need to overcome the electrostatic force gap, and for this reason, the movable electrodes 4a and 4b can start vibrating even with low acceleration. In addition, once the movable electrodes 4a and 4b start vibrating, the electrostatic force gap is overcome by the kinetic energy of a shift into the operation range h1<Z. In other words, power can be generated even when the acceleration of excitation is low by using the vibration energy harvester 1 in the embodiment.

Figure 4:
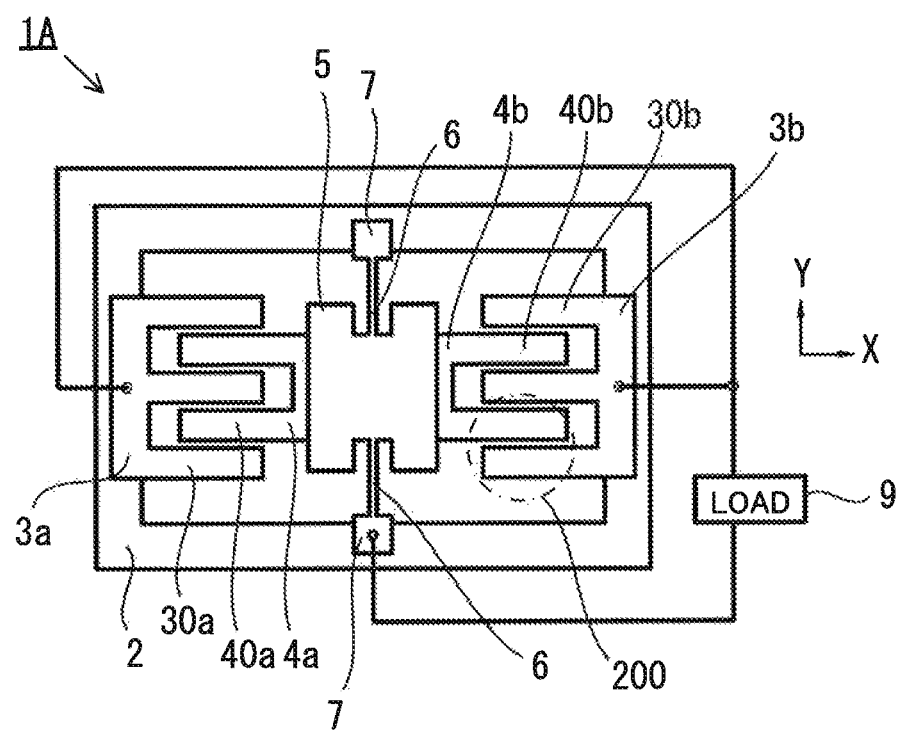
FIG. 4 shows a plan view schematically illustrating the structure of a vibration energy harvester achieved as a comparison example.

A comparison example providing a comparison to the vibration energy harvester 1 in the embodiment, which does not have a range over which the electrostatic capacitance remains unchanged, such as that described above, will be described. FIG. 4 is a plan view schematically illustrating the structure of a vibration energy harvester 1A achieved as the comparison example. The vibration energy harvester 1A in FIG. 4 includes a base 2, fixed electrodes 3a and 3b, movable electrodes 4a and 4b, a movable portion 5, a elastic support portion 6 and a connection pad portion 7, as does the vibration energy harvester 1 in the first embodiment shown in FIG. 1. In addition, a load 9 is connected to the vibration energy harvester 1A.

Figure 5A:
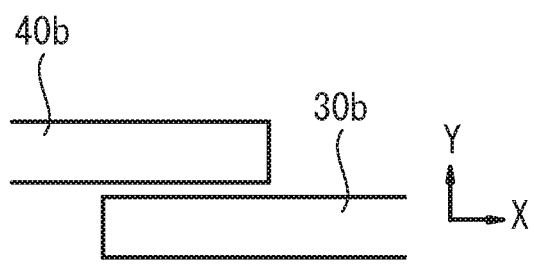
FIGS. 5A to 5C show partial enlargements of the fixed electrode and the movable electrode in the vibration energy harvester achieved as a comparison example.
Figure 5B:
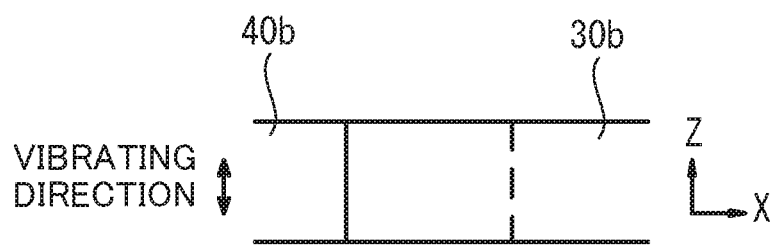
Figure 5C:
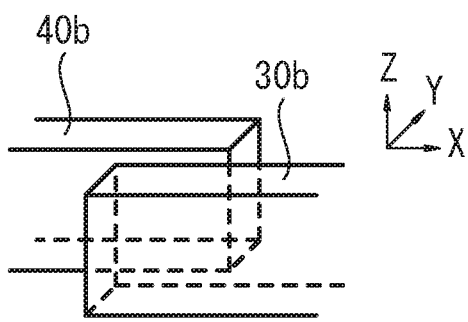

FIG. 5 presents partial enlargements of the fixed electrode 3b and the movable electrode 4b in the vibration energy harvester 1A in the comparison example. It provides enlarged views of a specific area 200 in FIG. 4. FIG. 5(a) presents a top view of the specific area 200, FIG. 5(b) is a front view of the specific area 200 and FIG. 5(c) is a perspective of the specific area 200. As shown in FIG. 4 and FIG. 5, the vibration energy harvester 1A is different from the vibration energy harvester 1 in that no stage is formed at the comb tooth 40b in the movable electrode 4b. It is to be noted that while FIG. 5 only shows the comb tooth 40b present in the specific area 200, no stage is formed at the other comb tooth 40b in the movable electrode 4b or neither of the comb teeth 40a in the movable electrode 4a either.

Figure 6:
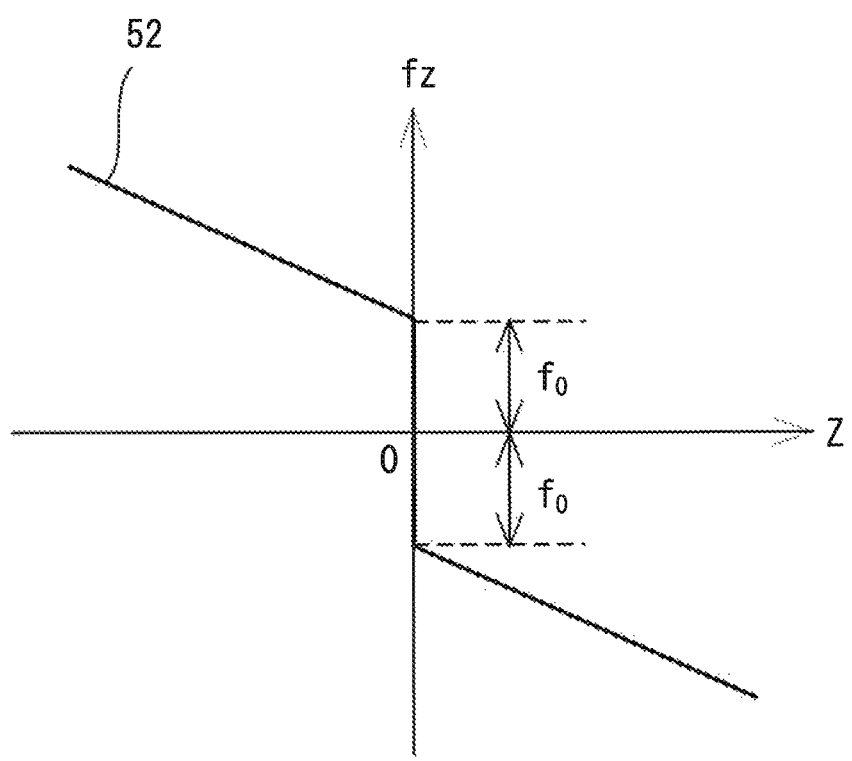
FIG. 6 shows a diagram indicating the relationship between the extent of displacement of the movable electrode and the force applied to the movable electrode, observed in the vibration energy harvester achieved as a comparison example.

FIG. 6 presents a diagram indicating the relationship between the extent of displacement of the movable electrodes 4a and 4b along the Z direction and the force applied to the movable electrodes 4a and 4b observed in the vibration energy harvester 1A achieved as a comparison example. In the comparison example, the force fz acting on the movable electrodes 4a and 4b along the Z direction as the movable electrodes 4a and 4b vibrate along the Z direction changes as indicated by a graph 52 in FIG. 6.

In the comparison example no stages are formed at the comb teeth 40a and 40b in the movable electrodes 4a and 4b, as explained above and thus, the graph 52 does not include any non-operation range, such as that described in reference to the graph 51 in FIG. 3. This means that when the movable electrodes 4a and 4b in a stationary state with Z at 0, start moving in the Z+ direction or the Z− direction, the electrostatic force gap must be overcome by satisfying the condition expressed in (1) below. It is to be noted that m and a in conditional expression (1) respectively represent the mass of the movable portions (i.e., the movable electrodes 4a and 4b and the movable portion 5) in the vibration energy harvester 1A and the acceleration of vibration. In addition, f0 represents the extent of the electrostatic force gap.

$$|m \cdot a| \geq f0 \quad (1)$$

As described above, if the acceleration of vibration is low, the movable electrodes 4a and 4b in a stationary state with Z at 0, cannot start moving in the comparison example. This means that the vibration energy harvester 1A in the comparison example is different from the vibration energy harvester 1 achieved in the first embodiment in that power cannot be generated if the acceleration of excitation is low.

Next, in reference to FIGS. 7 and 8, the effects of the present invention will be explained in specific detail. FIGS. 7 and 8 present diagrams indicating the relationship between the amplitude of the movable electrodes 4a and 4b and the output power that will manifest in the vibration energy harvester 1A in the comparison example and in the vibration energy harvester 1 achieved in the first embodiment. FIGS. 7(a) and 7(b) present simulation results respectively indicating the amplitude of the movable electrodes 4a and 4b and the output power that will register when an acceleration of 1600 m/s$^2$ is applied to the vibration energy harvester 1A with a 0.1 ms pulse width. FIGS. 7(c) and 7(d) present simulation results respectively indicating the amplitude of the movable electrodes 4a and 4b and the output power that will register when an acceleration of 1600 m/s$^2$ is applied to the vibration energy harvester 1 with a 0.1 ms pulse width. FIGS. 8(a) and 8(b) present simulation results respectively indicating the amplitude of the movable electrodes 4a and 4b and the output power that will register when an acceleration of 800 m/s$^2$ is applied to the vibration energy harvester 1A with a 0.5 ms pulse width. FIGS. 8(c) and 8(d) present simulation results respectively indicating the amplitude of the movable electrodes 4a and 4b and the output power that will register when an acceleration of 800 m/s$^2$ is applied to the vibration energy harvester 1 with a 0.5 ms pulse width.

When acceleration pulses are applied at 1600 m/s$^2$×0.1 ms, the relatively high acceleration allows the movable electrodes 4a and 4b in a stationary state to start vibrating by overcoming the electrostatic force gap even in the vibration energy harvester 1A in the comparison example, as indicated in FIG. 7(a). As a result, a certain level of output power can be achieved even in the vibration energy harvester 1A, as indicated in FIG. 7(b). In the vibration energy harvester 1 achieved in the embodiment, the movable electrodes 4a and 4b can start accelerating in the non-operation range explained earlier and thus, the movable electrodes 4a and 4b in the vibration energy harvester 1 achieve a greater amplitude, as indicated in FIG. 7(c), than the amplitude achieved in the vibration energy harvester 1A. Consequently, greater power can be output via the vibration energy harvester 1 than that obtained via the vibration energy harvester 1A, as indicated in FIG. 7(d).

When acceleration pulses are applied at 800 m/s$^2$×0.5 ms, the movable electrodes 4a and 4b in a stationary state cannot start vibrating by overcoming the electrostatic force gap in the vibration energy harvester 1A in the comparison example, as indicated in FIG. 8(a), due to the relatively low acceleration. As a result, no power can be output from the vibration energy harvester 1A, as indicated in FIG. 8(b). In contrast, the movable electrodes 4a and 4b in the vibration energy harvester 1 achieved in the first embodiment vibrate even at the low acceleration, as indicated in FIG. 8(c). Consequently, the vibration energy harvester 1 is able to provide an output power that cannot be obtained via the vibration energy harvester 1A, as indicated in FIG. 8(d).

Next, in reference to FIGS. 9 through 18, a method through which the vibration energy harvester 1 is formed will be described. FIGS. 9 through 18 illustrate an example of a fabrication/machining process through which the vibration energy harvester 1 achieved in the first embodiment of the present invention may be formed. It is to be noted that FIGS. 9 through 18 illustrate how part of the base 2, the fixed electrode 3b and the movable electrode 4b in the vibration energy harvester 1 in FIG. 1 are formed.

Figure 9A:
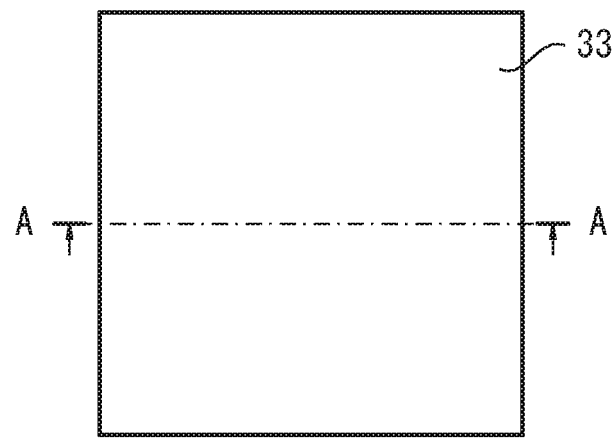
FIGS. 9A and 9B show illustrations of an example of a fabrication process through which the vibration energy harvester achieved in the first embodiment of the present invention may be formed.
Figure 9B:
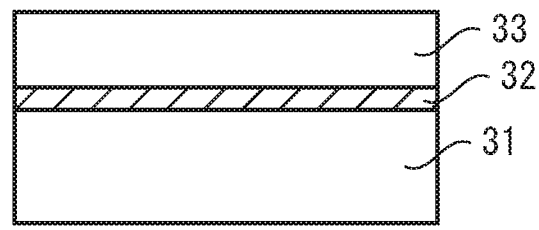

FIG. 9(a) is a plan view of an SOI (silicon on insulator) substrate used to form the vibration energy harvester 1, whereas FIG. 9(b) provides a sectional view taken along A-A in FIG. 9(a). The vibration energy harvester 1 is formed through a standard MEMS fabrication technology by using, for instance, an SOI substrate such as that shown in FIG. 9(a). The SOI substrate is formed by laminating a lower Si layer 31 where a handle layer is formed, an SiO$_2$ layer 32 where a BOX layer is formed and an upper Si layer 33 where a device layer is formed one upon another. It is to be noted that while an Si substrate, which has been doped so as to ensure better adhesion to a metal to constitute the connection pad portion or assure better electric conductivity may be used, the present invention may be adopted in conjunction with an Si substrate doped to achieve either P characteristics or N characteristics.

Figure 10A:
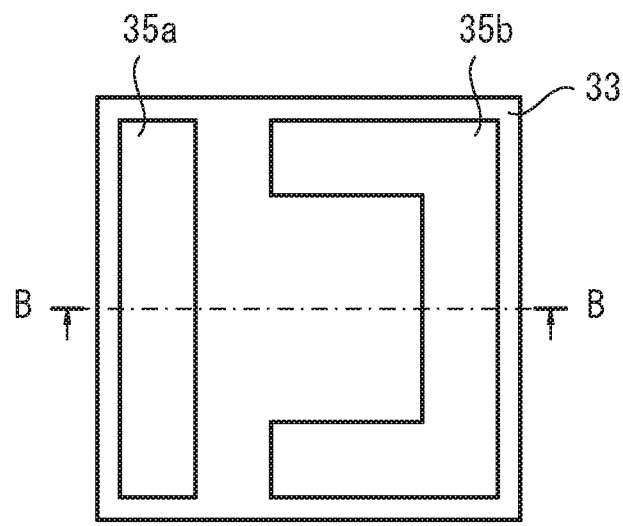
FIGS. 10A and 10B show illustrations of an example of a fabrication process through which the vibration energy harvester achieved in the first embodiment of the present invention may be formed.
Figure 10B:
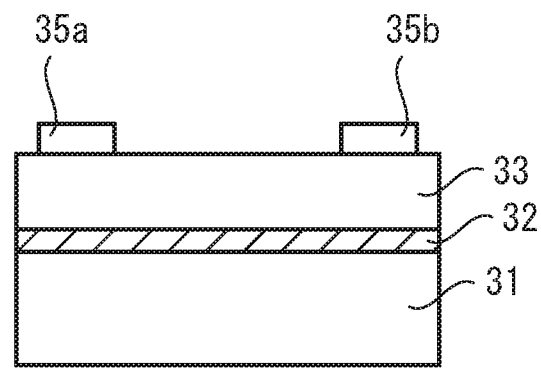

FIG. 10(a) is a plan view of the SOI substrate during a first step, whereas FIG. 10(b) provides a sectional view taken along B-B in FIG. 10(a). After applying a resist onto the upper Si layer 33, resist patterns 35a and 35b are formed through photolithography by using a photomask, as shown in FIG. 10 through the first step. Subsequently, the resist patterns 35a and 35b are hardened through hard baking.

Figure 11A:
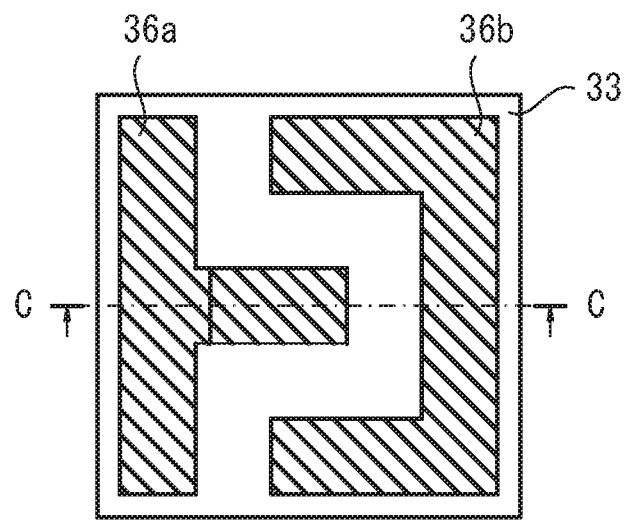
FIGS. 11A and 11B show illustrations of an example of a fabrication process through which the vibration energy harvester achieved in the first embodiment of the present invention may be formed.
Figure 11B:
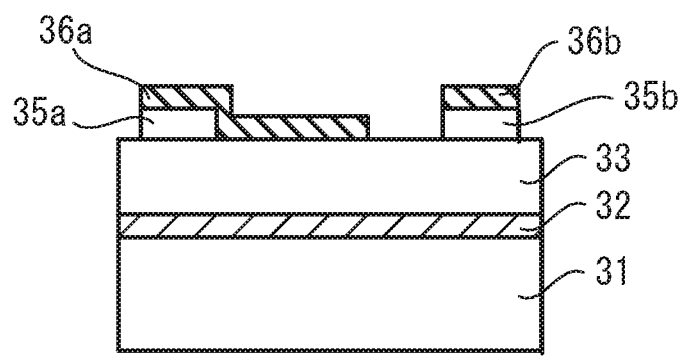

FIG. 11(a) is a plan view of the SOI substrate during a second step, whereas FIG. 11(b) provides a sectional view taken along C-C in FIG. 11(a). After aluminum is deposited through evaporation onto the upper Si layer 33 where the resist patterns 35a and 35b have been formed through the first step, μl patterns 36a and 36b are formed through photolithography by using a photomask, in the second step, as illustrated in FIG. 11.

Figure 12A:
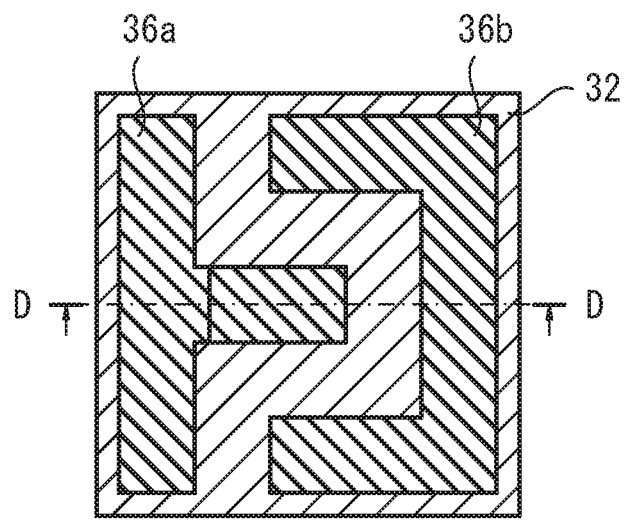
FIGS. 12A and 12B show illustrations of an example of a fabrication process through which the vibration energy harvester achieved in the first embodiment of the present invention may be formed.
Figure 12B:
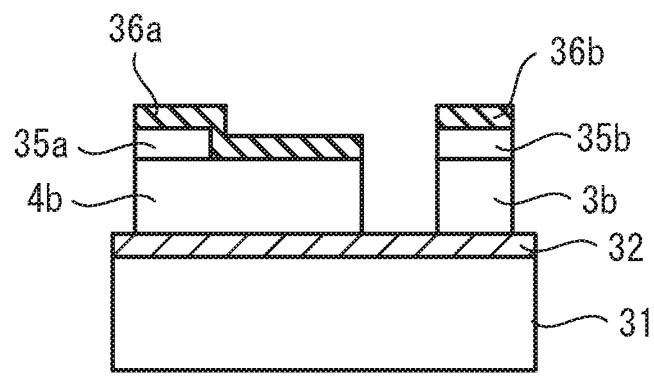

FIG. 12(a) is a plan view of the SOI substrate during a third step, whereas FIG. 12(b) provides a sectional view taken along D-D in FIG. 12(a). In the third step, a DRIE (Deep Reactive Ion Etching) process is executed on the upper Si layer 33 having undergone the first and second steps so as to form a fixed electrode 3b and a movable electrode 4b, as shown in FIG. 12.

Figure 13A:
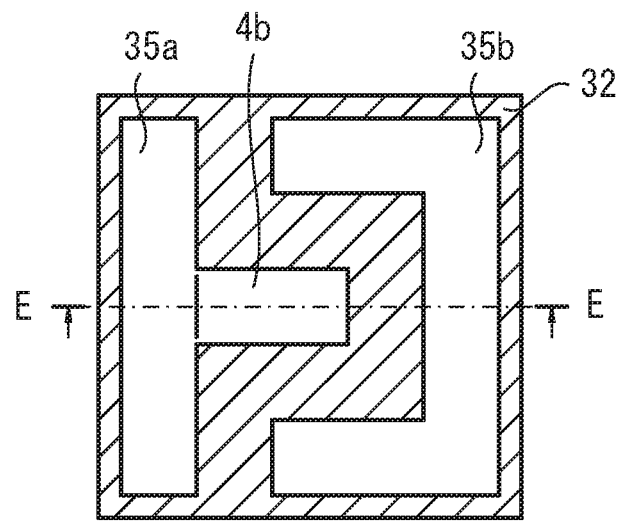
FIGS. 13A and 13B show illustrations of an example of a fabrication process through which the vibration energy harvester achieved in the first embodiment of the present invention may be formed.
Figure 13B:
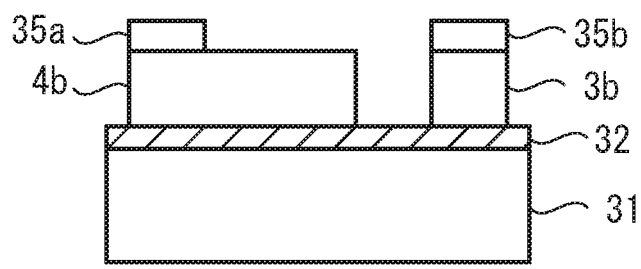

FIG. 13(a) is a plan view of the SOI substrate during a fourth step, whereas FIG. 13(b) provides a sectional view taken along E-E in FIG. 13(a). In the fourth step, the μl patterns 36a and 36b present on the fixed electrode 3b and the movable electrode 4h having been formed through the third step are removed through Al etching.

Figure 14A:
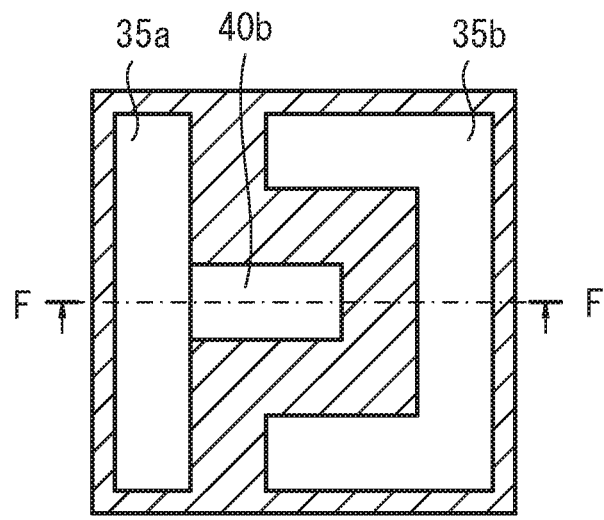
FIGS. 14A and 14B show illustrations of an example of a fabrication process through which the vibration energy harvester achieved in the first embodiment of the present invention may be formed.
Figure 14B:
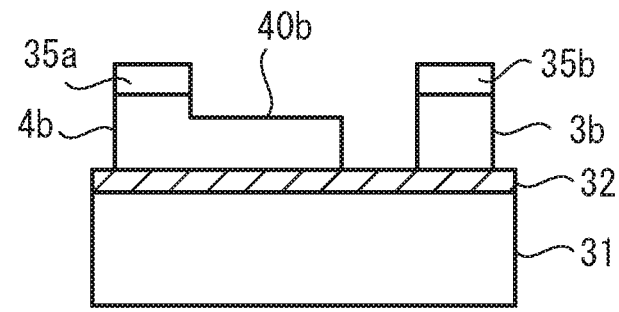

FIG. 14(a) is a plan view of the SOI substrate during a fifth step, whereas FIG. 14(b) provides a sectional view taken along F-F in FIG. 14(a). In the fifth step, the movable electrode 4b having been formed through the third step undergoes slight process through DRIE so as to form a comb tooth 40b with a staged structure, as illustrated in FIG. 14.

Figure 15A:
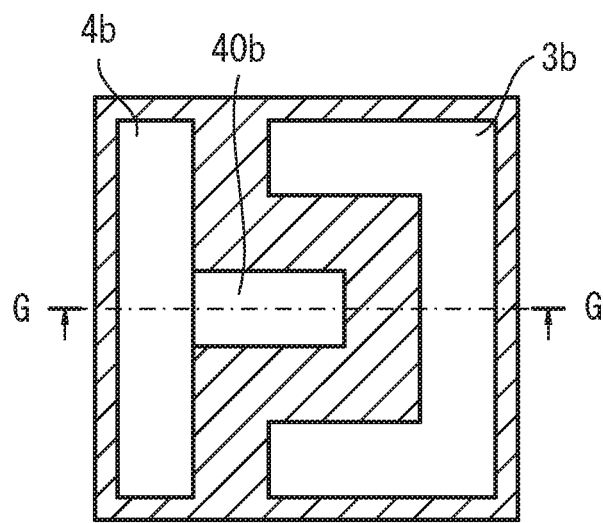
FIGS. 15A and 15B show illustrations of an example of a fabrication process through which the vibration energy harvester achieved in the first embodiment of the present invention may be formed.
Figure 15B:
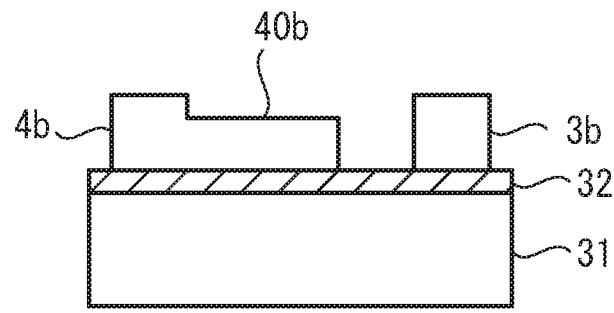

FIG. 15(a) is a plan view of the SOI substrate during a sixth step, whereas FIG. 15(b) provides a sectional view taken along G C in FIG. 15(a). In the sixth step, the resist patterns 35a and 35b on the fixed electrode 3b and the movable electrode 4b, having been formed through the third step, are removed through resist etching. Once the sixth step has been executed, fabrication for the surface of the SOI substrate, i.e., the device layer, is completed.

Figure 16A:
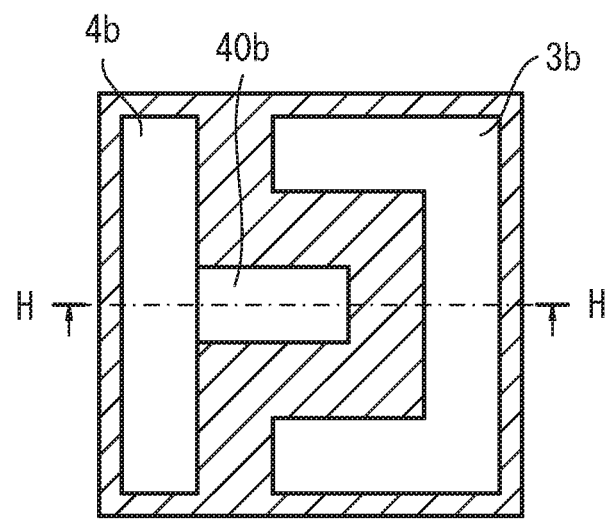
FIGS. 16A and 16B show illustrations of an example of a fabrication process through which the vibration energy harvester achieved in the first embodiment of the present invention may be formed.
Figure 16B:
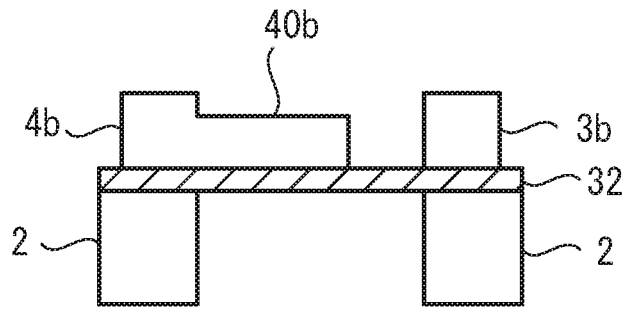

FIG. 16(a) is a plan view of the SOI substrate during a seventh step, whereas FIG. 16(b) provides a sectional view taken along H-H in FIG. 16(a). In the seventh step, a base 2 is formed through photolithography and DRIE process executed on the lower Si layer 31.

Figure 17A:
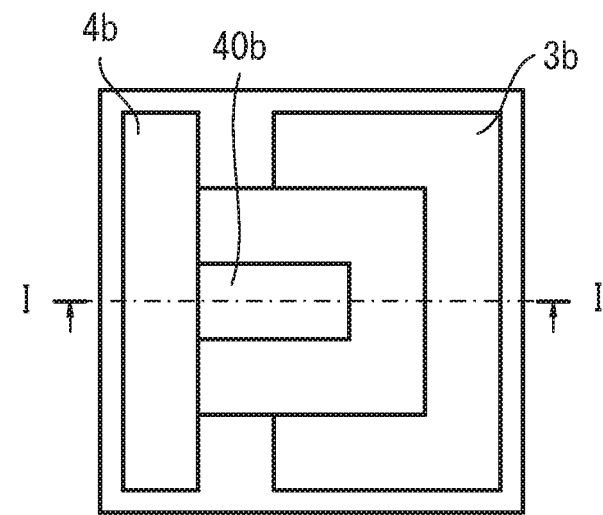
FIGS. 17A and 17B show illustrations of an example of a fabrication process through which the vibration energy harvester achieved in the first embodiment of the present invention may be formed.
Figure 17B:
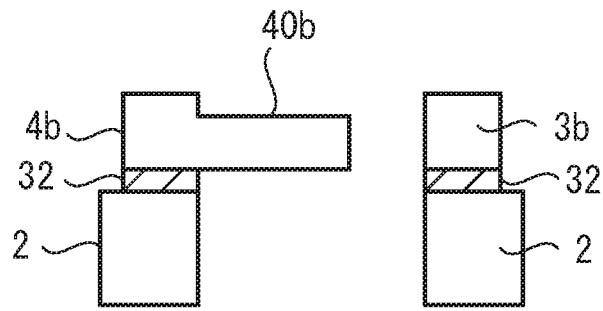

FIG. 17(a) is a plan view of the SOI substrate during an eighth step, whereas FIG. 17(b) provides a sectional view taken along I-I in FIG. 17(a). In the eighth step, the SiO$_2$ layer 32 is etched so as to remove any superfluous area. Once the eighth step has been executed, fabrication on the SOI substrate is completed.

Figure 18:
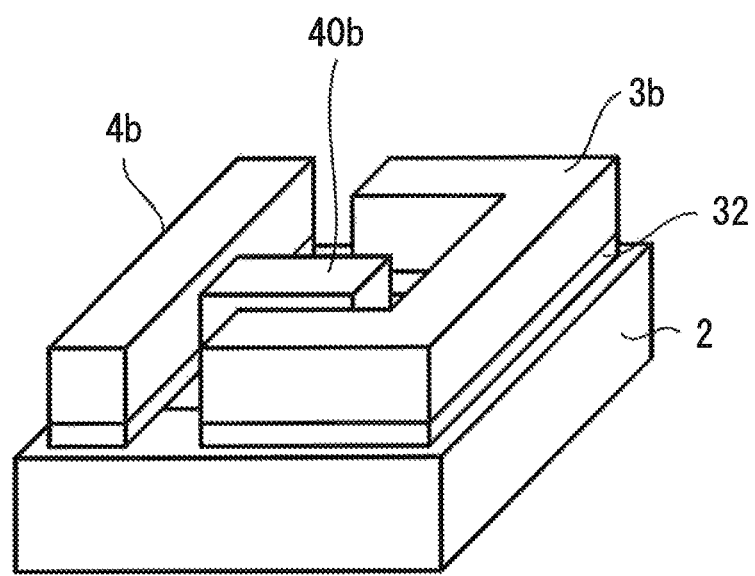
FIG. 18 shows an illustration of an example of a fabrication process through which the vibration energy harvester achieved in the first embodiment of the present invention may be formed.

FIG. 18 shows the SOI substrate having undergone the fabrication process in a perspective. The SOI substrate having been fabricated to achieve a shape such as that shown in FIG. 18 then undergoes thermal oxidation, nitride film etching, BT process (charge processing) and the like, and as a result, an electret is formed at least at either the fixed electrode 3b or the movable electrode 4b. Subsequently, the SOI substrate undergoes a packaging step and the vibration energy harvester 1 is thus manufactured as a finished product.

The following operations and advantages are achieved through the first embodiment of the present invention described above.

(1) The vibration energy harvester 1 includes fixed electrodes 3a and 3b and movable electrodes 4a and 4b that can be displaced respectively relative to the fixed electrodes 3a and 3b along a predetermined vibrating direction. At least either of the surfaces of the fixed electrode 3a and the movable electrode 4a, facing opposite each other, and at least either of the surfaces of the fixed electrode 3b and the movable electrode 4b facing opposite each other, are electrically charged. Power is generated as the movable electrodes 4a and 4b become displaced and thus a change occurs in the electrostatic capacitance between the fixed electrode 3a and the movable electrode 4a and between the fixed electrode 3b and the movable electrode 4b. The vibration energy harvester 1 has a non-operation range that includes, at least, the vibrational center of the movable electrodes 4a and 4b, over which the electrostatic capacitance remains unchanged even as the movable electrodes 4a and 4b are displaced. This structural feature makes it possible to achieve a vibration energy harvester 1 capable of generating power even when the acceleration of excitation is low.

(2) The fixed electrodes 3a and 3b and the movable electrodes 4a and 4b are comb-tooth electrodes that include comb teeth 30a, comb teeth 30b, comb teeth 40a and comb teeth 40b respectively. Thus, the vibration energy harvester 1 can be provided as a compact unit assuring a higher level of power generating capability/performance.

(3) The movable electrodes 4a and 4b vibrate along a Z direction running perpendicular to the direction (X direction) along which the comb teeth 30a, 30b, 40a and 40b at the various comb-tooth electrodes extend and the direction (Y direction) along which the comb teeth 30a, 30b, 40a and 40b are set one after another. These structural features make it possible to raise resistance against pull-in of the movable electrodes 4a and 4b, by increasing the spring constant of the elastic support portion 6 along both the X direction and the Y direction. This, in turn, makes it possible to set a greater amount of charge for the electrets so as to even further improve the power generating capability of the vibration energy harvester 1.

(4) The vibration energy harvester 1, which includes staged portions with a stage depth running along the vibrating direction, i.e., along the Z direction, present over at least part of the individual comb teeth 40a and 40b at the movable electrodes 4a and 4b, formed as comb-tooth electrodes, has a non-operation range over which the electrostatic capacitance remains unchanged. As a result, in the vibration energy harvester 1 adopting a structure that facilitates fabrication with ease, a non-operation range can be set.

Second Embodiment

Figure 19:
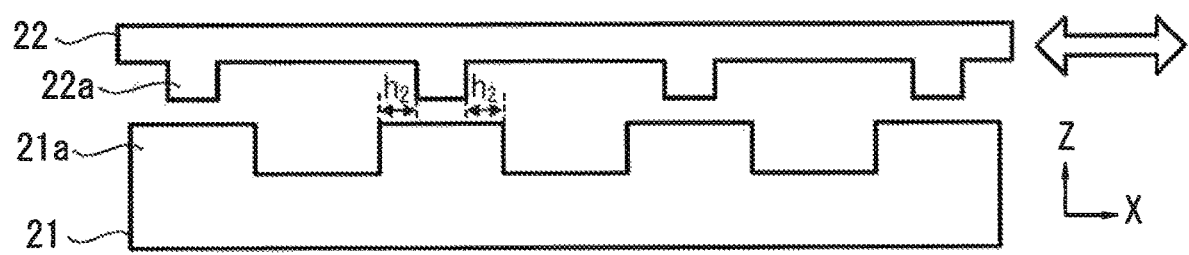
FIG. 19 shows an illustration of the electrode structure adopted in the vibration energy harvester achieved in a second embodiment of the present invention.

Next, the second embodiment of the present invention will be described. FIG. 19 illustrates an electrode structure adopted in the vibration energy harvester achieved in the second embodiment of the present invention. The vibration energy harvester in the embodiment includes a fixed electrode 21 and a movable electrode 22 disposed so as to face opposite each other as illustrated in FIG. 19. It is to be noted that FIG. 19 does not include an illustration of structural elements configuring the vibration energy harvester apart from the fixed electrode 21 and the movable electrode 22.

The movable electrode 22 is supported via an elastic support portion (not shown) so that it is allowed to slide to the left and to the right (along the X direction) in the figure relative to the fixed electrode 21. First projecting portions 21a and second projecting portions 22a are respectively disposed at the fixed electrode 21 and the movable electrode 22, over predetermined intervals along the X direction, so as to face opposite each other. As FIG. 19 shows, the width of each second projecting portion 22a at the movable electrode 22, measured along the X direction, is set smaller than the width of each first projecting portion 21a at the fixed electrode 21.

Each electret is formed near the surface of at least either each first projecting portion 21a at the fixed electrode 21 or each second projecting portion 22a at the movable electrode 22, the surface facing the opposite surface. This means that the surfaces of at least the fixed electrode 21 or the movable electrode 22, among the surfaces of the fixed electrode 21 and the movable electrode 22 facing opposite each other, are electrically charged.

As an environmental vibration causes the vibration energy harvester in the embodiment to oscillate along a direction that contains an X direction component, the movable electrode 22 vibrates and becomes displaced along the X direction relative to the fixed electrode 21. As a result, the first projecting portions 21a at the fixed electrode 21 and the second projecting portions 22a at the movable electrode 22 become offset relative to each other along the X direction, which, in turn, results in a change in the size of the area over which the first projecting portions 21a and the second projecting portions 22a face opposite each other, thereby altering the electrostatic capacitance between the fixed electrode 21 and the movable electrode 22. This change in the electrostatic capacitance, combined with induced electric charges at the electrets, causes a change in the voltage between the fixed electrode 21 and the movable electrode 22, resulting in generation of an electromotive force. Power is thus generated in the vibration energy harvester 1 in the embodiment.

Figure 20:
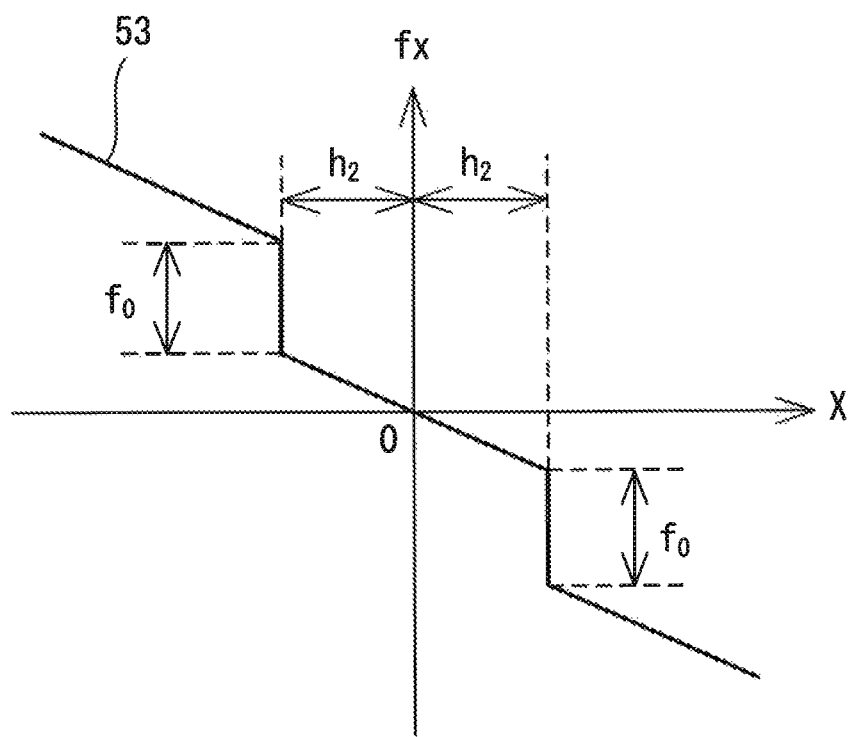
FIG. 20 shows a diagram indicating the relationship between the extent of displacement of the movable electrode and the force applied to the movable electrode, observed in the vibration energy harvester achieved in the second embodiment of the present invention.

FIG. 20 presents a diagram indicating the relationship between the extent of displacement of the movable electrode 22 along the X direction and the force applied to the movable electrode 22 observed in the vibration energy harvester achieved in the second embodiment of the present invention. In the embodiment, a force fx in action in the X direction, applied to the movable electrode 22 as the movable electrode 22 vibrates along the X direction with a vibrational center at X=0, changes as indicated by a graph 53 in FIG. 20. In FIG. 20, the extent of displacement in the X direction is indicated along the horizontal axis, whereas the level of the force a is indicated along the vertical axis.

As the graph 53 indicates, in the embodiment, a range $-h2 \leq X \leq h2$ which includes the position X=0, i.e., the vibrational center of the movable electrode 22, is equivalent to the non-operation range explained in reference to the first embodiment. No electrostatic force is at work along the X direction between the movable electrode 22 and the fixed electrode 21 over the non-operation range and for this reason, the force fx changes at a constant rate in correspondence to the spring constant of the elastic support portion. h2 represents the length measured from either the left end or the right end of a second projecting portion 22a at the movable electrode 22 to the left or right end of the corresponding first projecting portion 21a at the fixed electrode 21 as indicated in FIG. 19. At the points of transition from the non-operation range to an operation range X<-h2 and an operation range h2<X, however, the movable electrode 22 becomes offset relative to the fixed electrode 21 along the X direction, as explained earlier, and thus, an electrostatic force is in action along the X direction between the movable electrode 22 and the fixed electrode 21. As a result, an electrostatic force gap f0 occurs at the boundaries (X=-h2 and X=h2) between the non-operation range and the operation ranges as the graph 53 indicates and the force fx changes acutely.

In the vibration energy harvester in the embodiment, which includes the second projecting portions 22a formed at the movable electrode 22 and assuming a width measured along the X direction, smaller than the width of the first projecting portions 21a formed at the fixed electrode 21, a non-operation range over which an electrostatic force does not act between the movable electrode 22 and the fixed electrode 21 along the X direction, i.e., a range over which the electrostatic capacitance does not change, is set as explained above. As a result, the movable electrode 22 is allowed to start vibrating even at a low acceleration, as in the vibration energy harvester 1 achieved in the first embodiment described above. In addition, once the movable electrode 22 starts vibrating, the vibration energy harvester is able to overcome the electrostatic force gap with the kinetic energy and shift into an operation range. In other words, power can be generated even when the acceleration of excitation is low by using the vibration energy harvester in the embodiment, as in the first embodiment.

The fixed electrode 21 and the movable electrode 22 in the second embodiment of the present invention described above respectively include the first projecting portions 21a and the second projecting portions 22a disposed over predetermined intervals along the X direction, i.e., the vibrating direction, so as to face opposite each other. The width of the first projecting portion 21a at the fixed electrode 21 and the width of the second projecting portion 22a at the movable electrode 22, measured along the X direction, are different from each other, and thus, a range over which the electrostatic capacitance remains unchanged is set. In other words, a non-operation range can be set at the vibration energy harvester adopting a simple structure, as in the first embodiment.

It is to be noted that the relationship pertaining to the widths of the first and second projecting portions in the second embodiment of the present invention may be reversed from that shown in FIG. 19 and that the width of each of the second projecting portions 22a at the movable electrode 22, measured along the X direction, may be set greater than the width of each of the first projecting portions 21a at the fixed electrode 21. In this case, too, the operations and advantages described above will be achieved.

In addition, the vibration energy harvester according to the present invention may adopt a structure other than those described in reference to the first and second embodiments. For instance, the present invention may be adopted in any vibration energy harvester having a movable electrode and a fixed electrode disposed so as to face opposite each other with the movable electrode allowed to vibrate in a planar direction along the surfaces facing opposite each other or in any vibration energy harvester having a movable electrode and a fixed electrode disposed so as to face opposite each other with the movable electrode allowed to vibrate along a rotational direction relative to the fixed electrode. In addition, the present invention may be adopted in a structure having two movable electrodes facing opposite each other. Namely, the present invention may be adopted in a vibration energy harvester adopting any structure that includes a pair of electrodes, at least one of which is a movable electrode, disposed so as to face opposite each other and at least the surface of either electrode among the surfaces of the pair of electrodes facing opposite each other electrically charged as long as a range with at least the vibrational center of one of the electrodes present therein, over which the electrostatic capacitance between the pair of electrodes remains unchanged even if the electrode becomes displaced, is set.

The embodiments and variations thereof described above may each be adopted by itself or they may be adopted in any combination. In addition, the embodiments described above simply represent examples and as long as the features characterizing the present invention remain intact, the present invention is in no way limited to the particulars of the embodiments.

The disclosure of the following priority application is herein incorporated by reference:

Japanese Patent Application No, 2015-196736 (filed Oct. 2, 2015)

REFERENCE SIGNS LIST 1 vibration energy harvester
2 base
3a, 3b fixed electrode
30a, 30b comb tooth
4a, 4b movable electrode
40a, 40b comb tooth
5 movable portion
6 elastic support portion
7 connection pad portion
9 load
21 fixed electrode
21a first projecting portion
22 movable electrode
23a second projecting portion

The invention claimed is:

1. A vibration energy harvester, comprising:
a first electrode; and
a second electrode that can be displaced relative to the first electrode along a predetermined vibrating direction, wherein:
at least either of a surface of the first electrode and a surface of the second electrode facing opposite each other is electrically charged;
power is generated as the second electrode becomes displaced causing a change in electrostatic capacitance between the first electrode and the second electrode;
a range having included therein at least a vibrational center of the second electrode, over which the electrostatic capacitance remains unchanged even as the second electrode is displaced, is set;
the first electrode and the second electrode are comb-tooth electrodes;
the vibrating direction is perpendicular to a direction along which individual comb teeth of the first electrode extend, perpendicular to a direction along which the comb teeth of the first electrode are arranged one after another, perpendicular to a direction along which individual comb teeth of the second electrode extend, and perpendicular to a direction along which the comb teeth of the second electrode are arranged one after another; and
in the vibrating direction, a height of a tallest portion of the first electrode is equal to a height of a tallest portion of the second electrode, and one of the first electrode and the second electrode has a stepped portion with a height that is less than the height of the tallest portion.

2. The vibration energy harvester according to claim 1, wherein:
the first electrode is a fixed electrode.

3. The vibration energy harvester according to claim 2, wherein: the range over which the electrostatic capacitance remains unchanged is created by the stepped portion forming a staged portion with a depth of stage set along the vibrating direction, in at least part of the comb-tooth electrode.

4. The vibration energy harvester according to claim 1, wherein:
the first electrode is a movable electrode.

5. The vibration energy harvester according to claim 4, wherein: the range over which the electrostatic capacitance remains unchanged is created by the stepped portion forming a staged portion with a depth of stage set along the vibrating direction, in at least part of the comb-tooth electrode.

6. The vibration energy harvester according to claim 1, wherein: the range over which the electrostatic capacitance remains unchanged is created by the stepped portion forming a staged portion with a depth of stage set along the vibrating direction, in at least part of the comb-tooth electrode.

* * * * *